United States Patent [19]

Wu et al.

[11] Patent Number: 5,705,437
[45] Date of Patent: Jan. 6, 1998

[54] TRENCH FREE PROCESS FOR SRAM

[75] Inventors: Yi-Huang Wu, Hsi-Ying; Der-Chen Chen, Hsin-Chu, both of Taiwan

[73] Assignee: Taiwan Semiconductor Manufacturing Company, Ltd., Hsinchu, Taiwan

[21] Appl. No.: 719,383

[22] Filed: Sep. 25, 1996

[51] Int. Cl.[6] ............................................. H01L 21/8234
[52] U.S. Cl. ................... 438/238; 438/597; 148/DIG. 20
[58] Field of Search ................................ 438/238, 175, 438/262, 282, 597; 148/DIG. 20

[56] References Cited

U.S. PATENT DOCUMENTS

| 4,906,588 | 3/1990  | Harrington, III | 437/44 |
| 5,208,168 | 5/1993  | Parrillo et al. | 437/26 |
| 5,376,577 | 12/1994 | Roberts et al.  | 437/52 |
| 5,451,534 | 9/1995  | Yang            | 437/52 |
| 5,602,049 | 2/1997  | Wen et al.      | 437/52 |

*Primary Examiner*—John Niebling
*Assistant Examiner*—Joni Y. Chang
*Attorney, Agent, or Firm*—George O. Saile; Stephen B. Ackerman; Graham S. Jones, II

[57] ABSTRACT

A method of forming an FET device starts by forming a sacrificial layer over a semiconductor substrate and an outer buried contact region is produced by ion implantation into the substrate, followed by stripping the sacrificial layer, forming a gate oxide layer, and depositing polysilicon over the gate oxide layer. Then, etch an inner buried contact opening through the polysilicon and the gate oxide layer down to the substrate over the outer buried contact region forming an etched buried contact opening. Implant dopant into the substrate through the inner buried contact opening in the second mask to dope the substrate forming the inner buried contact region within the outer buried contact region self-aligned with the etched buried contact opening. Form a blanket, second polysilicon layer over the gate oxide layer reaching down through the etched buried contact opening into electrical and mechanical contact with the inner buried contact region. Etch to form the interconnect and the gate electrode from the polysilicon layers, and form source/drain regions.

22 Claims, 5 Drawing Sheets

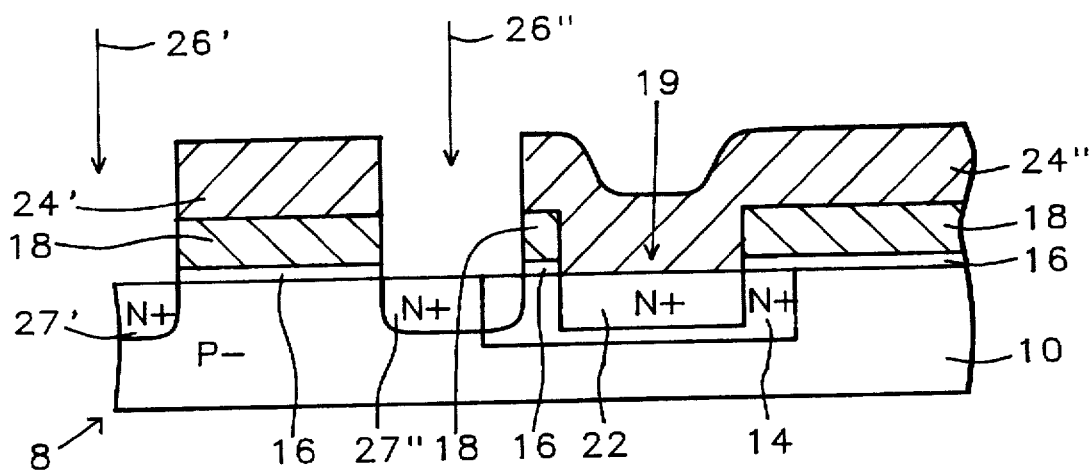
FIG. 8
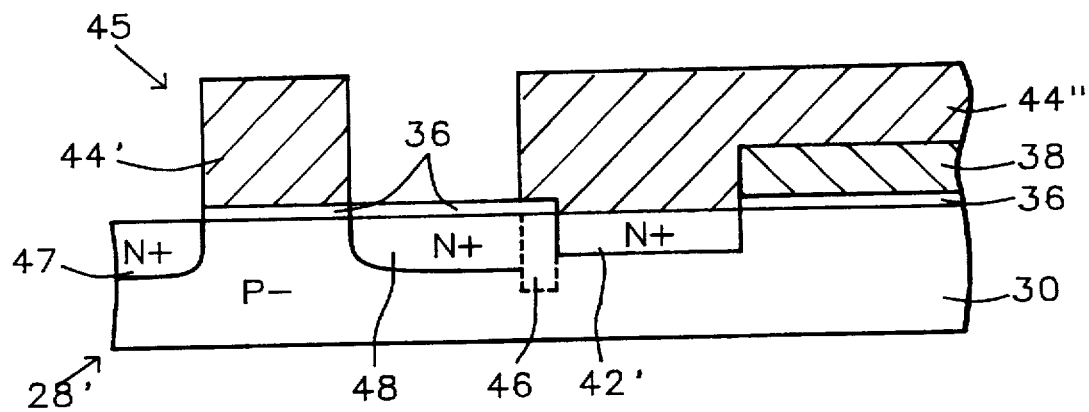
FIG. 9 - Prior Art
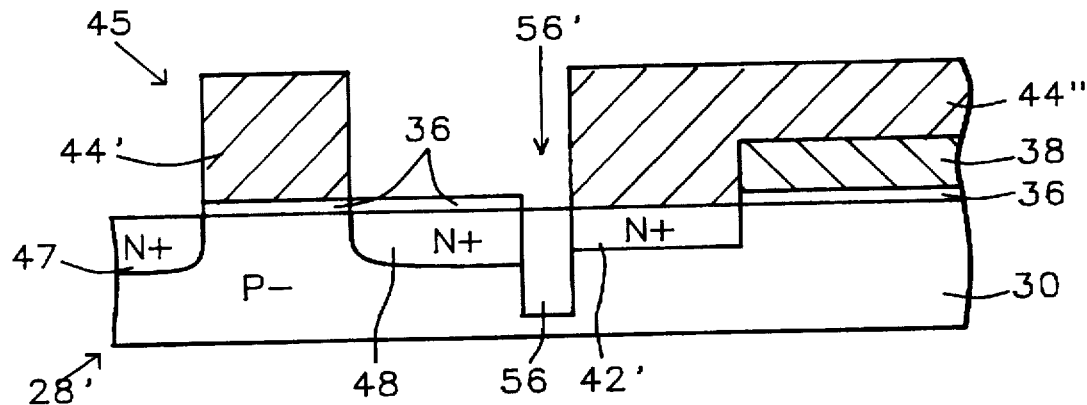
FIG. 10 - Prior Art 5,705,437

TRENCH FREE PROCESS FOR SRAM

BACKGROUND OF THE INVENTION

1. Field of the Invention

This invention relates to integrated circuit semiconductor devices and more particularly to memory devices.

2. Description of Related Art

In MOS silicon gate technology there are several ways of establishing connection between a doped polysilicon conductor layer and a doped silicon substrate which are separated by a gate oxide layer. One such form of contact is a "buried contact" which provides direct contact between the polysilicon conductor layer and the substrate through a window in the gate oxide formed where the buried contact is to be made. An ohmic contact between the doped polysilicon conductor layer and the substrate is made by diffusion from the doped polysilicon conductor layer (which is more heavily doped) of dopant into the substrate. Then an insulating film layer is formed covering the buried contact.

U.S. Pat. No. 5,451,534 shows the use of buried contacts in SRAM device integrated circuit designs. Lithography and etching are used to form openings in the gate oxide layer thereby defining the buried contact openings. Then doped polysilicon line patterns are formed over the device the openings.

FIG. 9 shows a prior art device 28' with a P– doped substrate 30 has been covered with a gate oxide layer 36 over which the doped polysilicon gate electrode 44' of an FET device 45 and a lower polysilicon layer 38 have been formed. The device 28' includes S/D regions 47/48 formed in the substrate 30. In addition, there is a buried contact BC1 region 42' formed in the substrate 30 comprising N+ doped source/drain regions 47/48. Drain region 48 is just to the left of BC1 region 42' but is separated therefrom by an undoped region 46 into which no ions have been implanted during the formation of a N+ doped S/D regions 47/48. The buried contact region 42 in substrate 30 to the right of the FET 45 has been formed by doping with N+ ions implanted therein. A second polysilicon layer (44', 44") was patterned to produce the gate electrode 44' and the interconnect 44" over the lower polysilicon layer 38 and the buried contact region 42'. Interconnect 44" reaches down into opening 19 into electrical and mechanical contact with buried contact region 42' and therethrough into electrical contact with the P– substrate 30. The undoped region 46 with its high electrical resistivity illustrates the problem of separation between the buried contact region 42' and the drain region 48 by an undoped region, which increases resistance therebetween resulting in large effective buried contact resistance.

FIG. 10 shows a modification of FIG. 9 in which the undoped region 46 has been replaced by a trench between the drain region 48 and the buried contact region 42'. This illustrates the problem of formation of a trench 56 between the buried contact region 42' and the drain 48 which arises with a conventional process during etching because the buried contact region 42' will be attacked easily during the process of etching during the polysilicon patterning step. This trench 56 will result in additional leakage if the trench 56 is too large.

SUMMARY OF THE INVENTION

An important aspect of the process of this invention is the formation of the gate electrode and the interconnect conductor of laminated polysilicon layers with a first polysilicon layer (formed over the gate oxide) patterned to overlap the buried contact region so that no trench may be formed. The overlap of the buried contact region and the laminated gate electrode assures that there is no trench etched between the drain and the buried contact in the manufacture of a device such as an SRAM device.

In accordance with another aspect of this invention, a method of formation of a MOSFET device including a gate electrode, source and drain regions, a buried contact and an interconnect connected to the buried contact, comprises the following sequence of steps. Provide a silicon semiconductor substrate. Form a sacrificial silicon dioxide layer over the substrate. Implant dopant into the substrate forming an outer buried contact region in the substrate. Remove the sacrificial silicon dioxide layer from the substrate. Form a gate oxide layer over the substrate. Form a first polysilicon layer over the gate oxide layer. Etch an inner buried contact opening through the first polysilicon layer and the gate oxide layer down to the surface of the substrate over the outer buried contact region to form an etched buried contact opening. Implant dopant into the substrate through the inner buried contact opening in the second mask to dope the substrate therethrough thereby forming the inner buried contact region within the outer buried contact region self-aligned with the etched buried contact opening. Form a blanket, second polysilicon layer over the gate oxide layer reaching down through the etched buried contact opening into electrical and mechanical contact with the inner buried contact region. Etch to form the interconnect and the gate electrode from the first and second polysilicon layers and implant dopant into the substrate forming source/drain regions self-aligned with the gate electrode.

Preferably, the gate oxide layer has a thickness between about 150 Å and about 180 Å, the first polysilicon layer has a thickness between about 550 Å and about 1,000 Å, and the second polysilicon layer has a thickness between about 1,500 Å and about 2,000 Å.

It is also preferred that the outer buried contact region is doped with a boron dopant dose from about $2E13$ atoms/cm$^2$ to about $2E14$ atoms/cm$^2$ resulting after annealing in a concentration from about $E18$ atoms/cm$^3$ to about $E19$ atoms/cm$^3$, and that the inner buried contact region is doped with a boron dopant dose from about $2E13$ atoms/cm$^2$ to about $2E14$ atoms/cm$^2$ resulting after annealing in a concentration from about $E18$ atoms/cm$^3$ to about $E19$ atoms/cm$^3$.

In addition it is preferred that the source/drain regions were doped with a dose of arsenic dopant from about $4.4E15$ atoms/cm$^2$ to about $5E15$ atoms/cm$^2$ resulting after annealing in a concentration from about $1E19$ atoms/cm$^3$ to about $1E20$ atoms/cm$^3$.

Another aspect of the method of this invention of formation of a MOSFET device comprising a gate electrode, source and drain regions, a buried contact and an interconnect connected to the buried contact comprises the following sequence of steps. On a silicon semiconductor substrate a sacrificial silicon dioxide layer is formed over the substrate. A first mask is formed over the sacrificial silicon dioxide layer, the first mask having an opening therethrough for defining an outer buried contact region in the substrate. Then implant dopant into the substrate through the outer buried contact opening in the first mask to dope the substrate therethrough to form the outer buried contact region. Next, remove the sacrificial silicon dioxide layer from the substrate, form a silicon dioxide, gate oxide layer over the substrate, form a first polysilicon layer over the gate oxide layer, form a second mask over the gate oxide layer the second mask having an inner buried contact opening therethrough for defining an inner buried contact region centered over the outer buried contact region in the substrate, etch through the inner buried contact opening removing the gate oxide layer and the first polysilicon layer below the inner buried contact opening down to the surface of the substrate over the outer buried contact region to form an etched buried contact opening, implant dopant into the substrate through the inner buried contact opening in the second mask to dope the substrate therethrough thereby forming the inner buried contact region within the outer buried contact region self-aligned with the etched buried contact opening. After stripping of the second mask, forming a blanket, second polysilicon layer over the gate oxide layer reaching down through the etched buried contact opening into electrical and mechanical contact with the inner buried contact region, form a third mask over the second polysilicon layer for patterning the second polysilicon layer, etch through the third mask to define the interconnect and to define the gate electrode from the first and second polysilicon layers, strip the third mask from the device, and implant dopant into the substrate forming source/drain regions self-aligned with the gate electrode.

Another alternative aspect of this invention includes a MOSFET device including a gate electrode, source and drain regions, a buried contact and an interconnect connected to the buried contact. On a silicon semiconductor substrate dopant is implanted into an outer buried contact region in the substrate. A a gate oxide layer overlies the substrate and a first polysilicon layer is formed over the gate oxide layer. There is a buried contact opening through the first polysilicon layer and the gate oxide layer with dopant implanted into an inner buried contact region within the outer buried contact region self-aligned with the buried contact opening. There is a second polysilicon layer over the gate oxide layer reaching down through the etched buried contact opening into electrical and mechanical contact with the inner buried contact region. The first and second polysilicon layers were patterned into an interconnect and the gate electrode. There is dopant implanted into the substrate as source/drain regions self-aligned with the gate electrode.

In accordance with this invention, a MOSFET device including a gate electrode, source and drain regions, a buried contact and an interconnect connected to the buried contact, comprise the following device. A silicon semiconductor substrate has dopant implanted into the substrate in an outer buried contact region, a silicon dioxide, gate oxide layer overlies the substrate, a first polysilicon layer overlies the gate oxide layer. An inner buried contact opening extends through the gate oxide layer and the first polysilicon layer down to the surface of the substrate over the outer buried contact region. An inner buried contact region lies within the outer buried contact region self-aligned with the etched buried contact opening. A second polysilicon layer overlies the gate oxide layer reaching down through the etched buried contact opening into electrical and mechanical contact with the inner buried contact region. An interconnect and the gate electrode were formed from the first and second polysilicon layers, and dopant is implanted into the substrate forming source/drain regions self-aligned with the gate electrode.

Preferably, the gate oxide layer has a thickness between about 150 Å and about 180 Å, the first polysilicon layer has a thickness between about 550 Å and about 1,000 Å, and the second polysilicon layer has a thickness between about 1,500 Å and about 2,000 Å.

Preferably, the outer buried contact region was doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$. In addition, the inner buried contact region was doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$. Furthermore, the source/drain regions were doped with a dose of arsenic dopant from about 4.4E15 atoms/cm$^2$ to about 5E15 atoms/cm$^2$ resulting after annealing in a concentration from about 1E19 atoms/cm$^2$ to about 1E20 atoms/cm$^3$.

BRIEF DESCRIPTION OF THE DRAWINGS

The foregoing and other aspects and advantages of this invention are explained and described below with reference to the accompanying drawings, in which:

FIG. 8 shows the device of FIG. 7 after the S/D mask has been stripped from the device showing the overlap between the drain region and the outer buried contact region.

FIG. 9 shows a prior art device with a P− doped substrate has been covered with a gate oxide layer over which the doped polysilicon gate electrode of an FET device and a lower polysilicon layer have been formed. An interconnect reaches down into an opening into electrical and mechanical contact with a buried contact region and therethrough into electrical contact with the P– substrate, but there is an undoped region with high electrical resistivity which illustrates the problem of separation between the buried contact region and the drain region by an undoped region, which increases resistance therebetween resulting in large effective buried contact resistance.

FIG. 10 shows a modification of FIG. 9 in which the undoped region has been replaced by a trench between the drain region and the buried contact region which illustrates the problem of formation of a trench between a buried contact region and the drain which arises with a conventional process during etching because the buried contact region is attacked easily during the process of etching during the polysilicon patterning step.

DESCRIPTION OF THE PREFERRED EMBODIMENT

Figure 1:
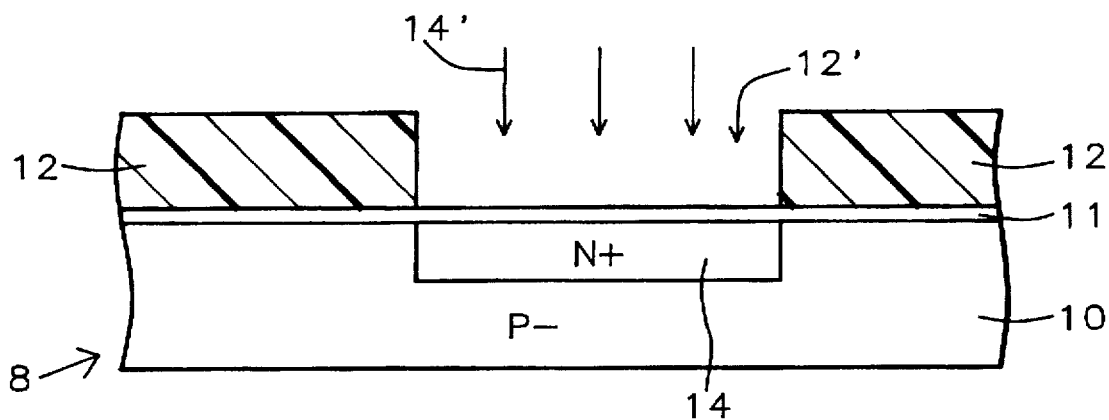
FIG. 1 shows a cross-sectional view of a device which is to be formed into a portion of an SRAM device in an early stage of fabrication after a P− substrate covered with an "oxide" layer covered with a mask with an opening for an outer buried contact region into which ions are implanted in through the sacrificial oxide layer to form an N+ doped outer buried contact region.

FIG. 1 shows a cross-sectional view of a device 8 which is to be formed into a portion of an SRAM device in an early stage of fabrication after a P– doped silicon substrate 10 has been covered with a sacrificial silicon dioxide "oxide" layer 11 on which a photoresist mask 12 with opening 12' has been formed for defining an outer buried contact BC1 region 14 which has been doped N+ by ions 14' which were ion implanted through opening 12' in mask 12 and through sacrificial "oxide" (silicon dioxide) layer 11 to form the N+ doped outer buried contact region 14.

The N+ boron dopant ions 14' are ion implanted through opening 12' into region 14 with a dose of from about 2E13 atoms/cm$^2$ to about 2E14 atoms/cm$^2$ resulting, after annealing, in a concentration of dopant from about 1E18 atoms/cm$^3$ to about 1E19 atoms/cm$^3$ at an energy from about 120 keV to about 100 keV.

Figure 2:
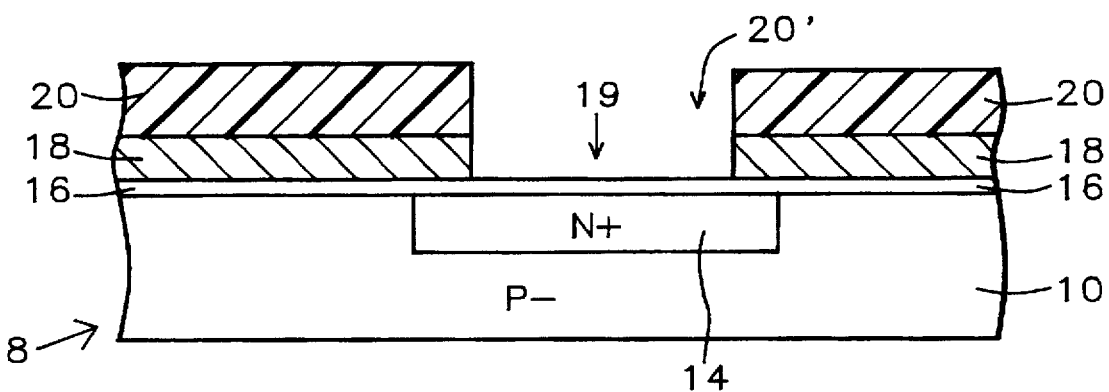
FIG. 2 shows the device of FIG. 1 after the mask and the oxide layer were stripped away and gate oxide layer and a doped first polysilicon conductor layer were formed over the substrate, followed by forming a second mask with an opening through which both the polysilicon layer and gate oxide layer have been etched through opening to form an inner buried contact opening through the first polysilicon layer and gate oxide layer to prepare for forming an inner buried contact in the subsequent steps illustrated in FIG. 3.

FIG. 2 shows the device of FIG. 1 after the photoresist mask 12 and the sacrificial layer 11 have been stripped from the device 8. Next, a gate oxide layer 16 has been formed over device 8 covering the substrate 10 and the outer buried contact region 14. Gate oxide layer 16 has a thickness between about 150 Å and about 180 Å. Then a doped first polysilicon conductor layer 18 has been formed over gate oxide layer 16. First polysilicon conductor layer 18 has a thickness between about 550 Å and about 1,000 Å.

Figure 3:
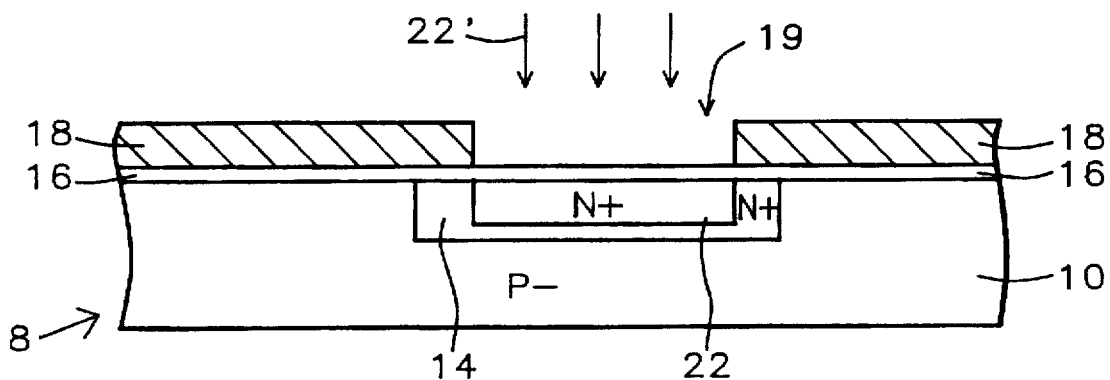
FIG. 3 shows the device of FIG. 2 after the photoresist mask has been stripped away and the inner buried contact opening was used during doping of inner buried contact region with boron dopant by ion implanting boron ions through the mask opening. The N+ doped inner buried contact region is formed within the transverse boundaries of the outer buried contact region and inner buried contact region is slightly shallower than the outer buried contact region.

Following formation of the doped first polysilicon conductor layer 18, the next step was to form a second mask 20 with an opening 20' through which both the first polysilicon layer 18 and gate oxide layer 16 have been etched through opening 20' to form an inner buried contact opening 19 through the first polysilicon layer 18 and gate oxide layer 16 to prepare for forming an inner buried contact in the subsequent steps illustrated in FIG. 3.

FIG. 3 shows the device of FIG. 2 after the photoresist mask 20 has been stripped from the device 8. The inner buried contact opening 19 is used during doping of inner buried contact region 22 with boron dopant by ion implanting boron ions 22' through buried contact opening 19. The inner buried contact region 22 is doped with a dose from about 2E13 atoms/cm$^2$ to about 2E14 atoms/cm$^2$ resulting in a dopant concentration from about 1E18 atoms/cm$^3$ to about 1E19 atoms/cm$^3$, at an energy from about 120 keV to about 150 keV. The N+ doped inner buried contact region 22 is formed within the transverse boundaries of the outer buried contact region 14 and inner buried contact region is slightly more shallow than the outer buried contact region. In other words, the inner buried contact region 22 is nested within the outer buried contact region 14.

Figure 4:
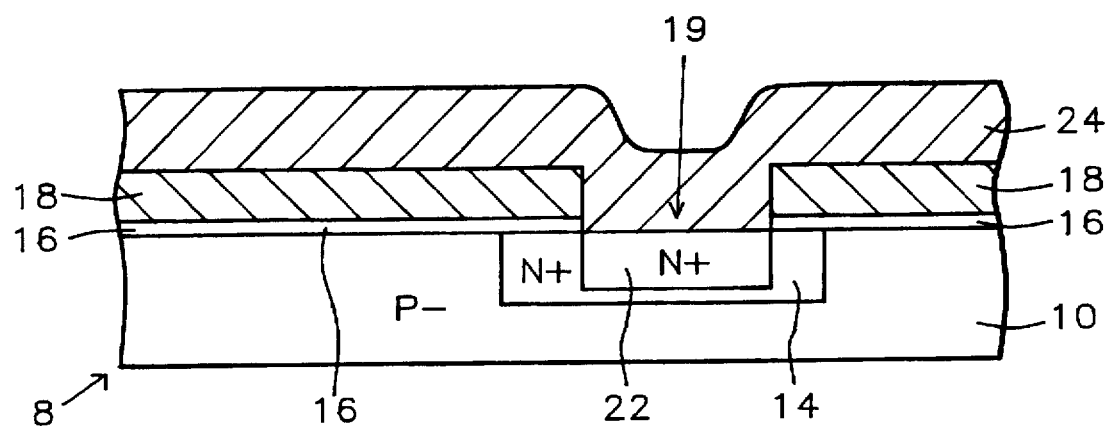
FIG. 4 shows the device of FIG. 3 after blanket deposition over the device of a second polysilicon conductor layer reaching down into the buried contact opening into electrical and mechanical contact with inner buried contact region.

FIG. 4 shows the device of FIG. 3 after blanket deposition over first polysilicon layer 18 and opening 19 of a second polysilicon conductor layer 24 followed by doping. Layer 24 reaches down into opening 19 into electrical and mechanical contact with inner buried contact region 22 and through inner buried contact region 22 and region 14 in electrical contact with the P– substrate 10. The second polysilicon conductor layer 24 has a thickness between about 1,500 Å and about 2,000 Å.

Figure 5:
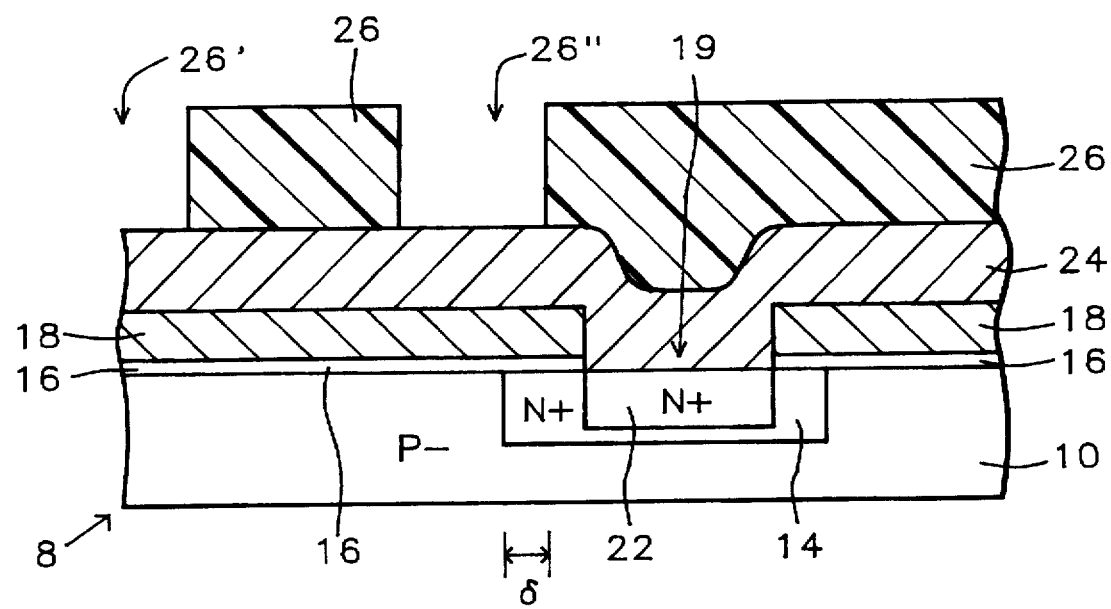
FIG. 5 shows the device of FIG. 4 after formation on the surface of the second polysilicon conductor layer of a polysilicon defining S/D and interconnect mask with gate electrode defining openings on either side of the gate electrode location.

FIG. 5 shows the device of FIG. 4 after formation on the surface of second polysilicon conductor layer 24 of a polysilicon defining mask 26 with gate electrode defining openings 26'/26" on either side of the gate electrode location. The opening 26" is provided to define the space between and the gate electrode and the interconnect/buried metallization.

Figure 6:
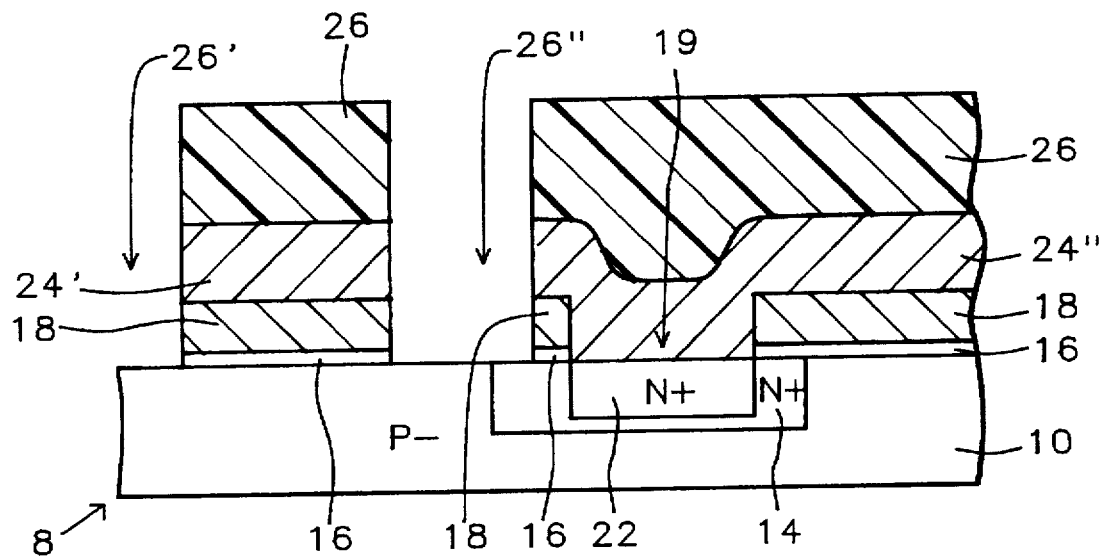
FIG. 6 shows the device of FIG. 5 after etching away portions of the first and second polysilicon layers through openings in the S/D mask defining the gate electrode and the interconnect.

FIG. 6 shows the device of FIG. 5 after etching away portions of the second polysilicon conductor layer 24 and first polysilicon conductor layer 18 through the openings 26', 26" in mask 26 defining the gate electrode 24' and the interconnect 24" to the left side of the region 22. It should be noted however that the right end of opening 26" overlies the inner buried contact region 22.

Figure 7:
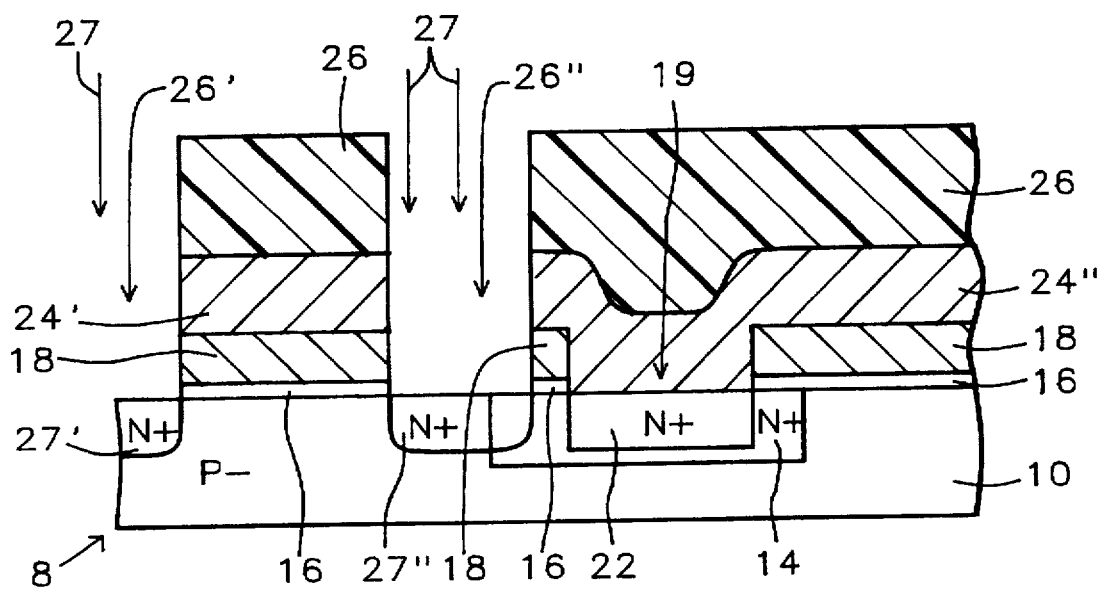
FIG. 7 shows the device of FIG. 6 after formation of doped S/D regions ion implanted through the S/D openings in the polysilicon defining mask.

FIG. 7 shows the device of FIG. 6 after formation of doped N+ S/D (source/drain) regions 27' and 27" by ions 27 which are ion implanted through openings 26' and 26" in the polysilicon defining mask 26. Ions 27 are ion implanted through openings 26'/26" into S/D regions 27' and 27" with a dose of arsenic dopant from about 4.4E15 atoms/cm$^2$ to about 5E15 atoms/cm$^2$ resulting in a concentration of dopant from about 1E19 atoms/cm$^3$ to about 1E20 atoms/cm$^3$, at an energy from about 35 keV to about 40 keV.

FIG. 8 shows the device 8 of FIG. 7 after the photoresist mask 26 has been stripped from the device 8 showing the overlap between the drain region 27" and the outer buried contact region 14 which provides the advantage that there is no trench and that contact resistance of the buried contact to the drain electrode is minimized.

Figure 11:
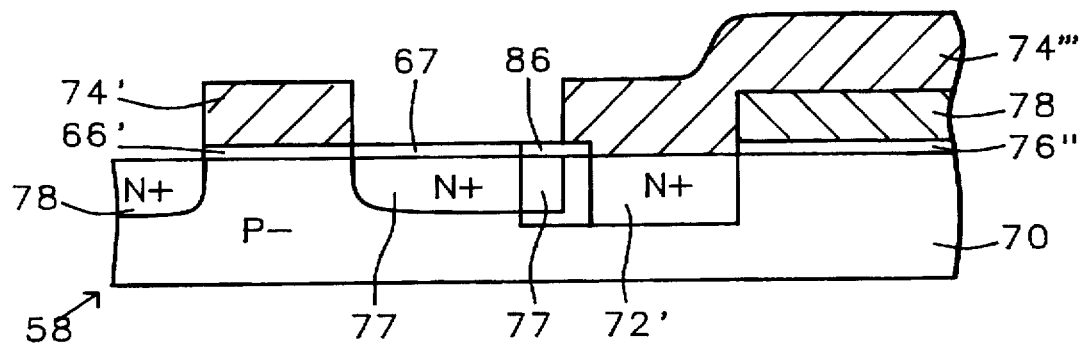
FIG. 11 shows a section of a buried contact design.

FIG. 11 shows a cross-sectional view of a buried contact design in a device 58 formed on P– doped silicon substrate 70. Oxide layer 66', 67, 86, 76" has been formed over device 58 covering the substrate 70, drain region 77 and the buried contact region 72'. A doped conductor layer 78 has been formed over gate oxide layer 76". An N+ doped buried contact region 72' has been formed adjacent to the first polysilicon conductor layer 78. The buried contact region 72' is formed below a second conductor 74'" which overlies conductor 78 and reaches down into contact with buried contact region 72'. A gate electrode 74' is formed over the gate oxide layer 66' and doped N+ S/D (source/drain) regions 77 and 78 are formed self-aligned with the gate electrode 74'. The drain region 77 is juxtaposed with the buried contact region 72'.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of formation of a MOSFET device including a gate electrode, source and drain regions, a buried contact

7 and an interconnect connected to said buried contact, comprising the sequence of steps as follows:

provided a silicon semiconductor substrate, forming a sacrificial silicon dioxide layer over said substrate, implanting dopant into said substrate forming an outer buried contact region in said substrate, removing said sacrificial silicon dioxide layer from said substrate, forming a gate oxide layer over said substrate, forming a first polysilicon layer over said gate oxide layer, etching an inner buried contact opening through said first polysilicon layer and said gate oxide layer down to the surface of said substrate over said outer buried contact region to form an etched buried contact opening, implanting dopant into said substrate through said inner buried contact opening in said second mask to dope said substrate therethrough thereby forming said inner buried contact region within said outer buried contact region self-aligned with said etched buried contact opening, forming a blanket, second polysilicon layer over said gate oxide layer reaching down through said etched buried contact opening into electrical and mechanical contact with said inner buried contact region, etching to form said interconnect and said gate electrode from said first and second polysilicon layers, and implanting dopant into said substrate forming source/drain regions self-aligned with said gate electrode.

2. A method in accordance with claim 1 wherein said gate oxide layer has a thickness between about 150 Å and about 180Å.

3. A method in accordance with claim 1 wherein said first polysilicon layer has a thickness between about 550 Å and about 1,000Å.

4. A method in accordance with claim 1 wherein said second polysilicon layer has a thickness between about 1,500 Å and about 2,000Å.

5. A method in accordance with claim 1 wherein said gate oxide layer has a thickness between about 150 Å and about 180 Å and said first polysilicon layer has a thickness between about 550 Å and about 1,000Å.

6. A method in accordance with claim 1 wherein said gate oxide layer has a thickness between about 150 Å and about 180 Å, said first polysilicon layer has a thickness between about 550 Å and about 1,000 Å, and said second polysilicon layer has a thickness between about 1,500 Å and about 2,000 Å.

7. A method in accordance with claim 1 wherein said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$.

8. A method in accordance with claim 1 wherein said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$.

9. A method in accordance with claim 1 wherein said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, and said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$.

8

10. A method in accordance with claim 1 wherein said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, and said source/drain regions are doped with a dose of arsenic dopant from about 4.4E15 atoms/cm$^2$ to about 5E15 atoms/cm$^2$ resulting after annealing in a concentration from about 1E19 atoms/cm$^3$ to about 1E20 atoms/cm$^3$.

11. A method in accordance with claim 1 wherein said gate oxide layer has a thickness between about 150 Å and about 180 Å, said first polysilicon layer has a thickness between about 550 Å and about 1,000 Å, and said second polysilicon layer has a thickness between about 1,500 Å and about 2,000 Å, said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, and said source/drain regions are doped with a dose of arsenic dopant from about 4.4E15 atoms/cm$^2$ to about 5E15 atoms/cm$^2$ resulting after annealing in a concentration from about 1E19 atoms/cm$^2$ to about 1E20 atoms/cm$^3$.

12. A method of formation of a MOSFET device including a gate electrode, source and drain regions, a buried contact and an interconnect connected to said buried contact, comprising the sequence of steps as follows:

providing a silicon semiconductor substrate, forming a sacrificial silicon dioxide layer over said substrate, forming a first mask over said sacrificial silicon dioxide layer, said first mask having an opening therethrough for defining an outer buried contact region in said substrate, implanting dopant into said substrate through said outer buried contact opening is said first mask to dope said substrate therethrough thereby forming said outer buried contact region, removing said sacrificial silicon dioxide layer from said substrate, forming a silicon dioxide, gate oxide layer over said substrate, forming a first polysilicon layer over said gate oxide layer, forming a second mask over said gate oxide layer said second mask having an inner buried contact opening therethrough for defining an inner buried contact region centered over said outer buried contact region in said substrate, etching through said inner buried contact opening removing said gate oxide layer and said first polysilicon layer below said inner buried contact opening down to the surface of said substrate over said outer buried contact region to form an etched buried contact opening, implanting dopant into said substrate through said inner buried contact opening in said second mask to dope said substrate therethrough thereby forming said inner buried contact region within said outer buried contact region self-aligned with said etched buried contact opening, after stripping of said second mask, forming a blanket, second polysilicon layer over said gate oxide layer reaching down through said etched buried contact opening into electrical and mechanical contact with said inner buried contact region, forming a third mask over said second polysilicon layer for patterning said second polysilicon layer, etching through said third mask to define said interconnect and to define said gate electrode from said first and second polysilicon layers, stripping said third mask from said device, and implanting dopant into said substrate forming source/drain regions self-aligned with said gate electrode.

13. A method in accordance with claim 12 wherein said gate oxide layer has a thickness between about 150 Å and about 180Å.

14. A method in accordance with claim 12 wherein said first polysilicon layer has a thickness between about 550 Å and about 1,000Å.

15. A method in accordance with claim 12 wherein said second polysilicon layer has a thickness between about 1,500 Å and about 2,000 Å.

16. A method in accordance with claim 12 wherein said gate oxide layer has a thickness between about 150 Å and about 180 Å and said first polysilicon layer has a thickness between about 550 Å and about 1,000 Å.

17. A method in accordance with claim 12 wherein said gate oxide layer has a thickness between about 150 Å and about 180 Å, said first polysilicon layer has a thickness between about 550 Å and about 1,000 Å, and said second polysilicon layer has a thickness between about 1,500 Å and about 2,000Å.

18. A method in accordance with claim 12 wherein said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$.

19. A method in accordance with claim 12 wherein said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$.

20. A method in accordance with claim 12 wherein said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, and said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$.

21. A method in accordance with claim 12 wherein said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, and said source/drain regions are doped with a dose of arsenic dopant from about 4.4E15 atoms/cm$^2$ to about 5E15 atoms/cm$^2$ resulting after annealing in a concentration from about 1E19 atoms/cm$^3$ to about 1E20 atoms/cm$^3$.

22. A method in accordance with claim 12 wherein said gate oxide layer has a thickness between about 150 Å and about 180 Å, said first polysilicon layer has a thickness between about 550 Å and about 1,000 Å, and said second polysilicon layer has a thickness between about 1,500 Å and about 2,000Å, said inner buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, said outer buried contact region is doped with a boron dopant dose from about 2E13 atoms/cm$^2$ to about 2E14 atoms/cm$^2$ resulting after annealing in a concentration from about E18 atoms/cm$^3$ to about E19 atoms/cm$^3$, and said source/drain regions are doped with a dose of arsenic dopant from about 4.4E15 atoms/cm$^2$ to about 5E15 atoms/cm$^2$ resulting after annealing in a concentration from about 1E19 atoms/cm$^3$ to about 1E20 atoms/cm$^3$.

* * * * *